United States Patent
Martin (10) Patent No.: US 6,495,830 B1
(45) Date of Patent: Dec. 17, 2002

(54) PROGRAMMABLE HYPER-SPECTRAL INFRARED FOCAL PLANE ARRAYS

(75) Inventor: Robert J. Martin, Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 19 days.

(21) Appl. No.: 09/666,828

(22) Filed: Sep. 21, 2000

(51) Int. Cl.⁷ .............................................. H01L 31/09
(52) U.S. Cl. ............................ 250/339.02; 250/338.1; 250/338.4; 250/339.01; 250/370.01
(58) Field of Search ........................... 250/332, 339.01, 250/339.02, 370.01, 370.08, 208.1; 257/291; 327/515

(56) References Cited

U.S. PATENT DOCUMENTS

| | | |
|---|---|---|
| 4,903,101 A | 2/1990 | Maserjian |
| 4,956,686 A | 9/1990 | Borrello et al. |
| 5,013,918 A | 5/1991 | Choi |
| 5,047,822 A | 9/1991 | Little, Jr. et al. |
| 5,198,659 A | 3/1993 | Smith et al. |
| 5,300,780 A | 4/1994 | Denney et al. |
| 5,355,000 A | 10/1994 | Delacourt et al. |
| 5,384,469 A | 1/1995 | Choi |
| 5,488,504 A | 1/1996 | Worchesky et al. |
| 5,539,206 A | 7/1996 | Schimert |
| 5,552,603 A * | 9/1996 | Stokes ...................... 250/338.4 |
| 5,629,522 A | 5/1997 | Martin et al. |
| 5,965,899 A | 10/1999 | Little, Jr. |
| 6,034,367 A * | 3/2000 | Waczynski et al. ....... 250/208.2 |
| 6,163,386 A * | 12/2000 | Kobayashi et al. .......... 358/482 |

OTHER PUBLICATIONS

Lester J. Kozlowski, et al., "LWIR 128×128 GaAs/AlGaAs Multiple Quantum Well Hybrid Focal Plane Array", IEEE Translation on Electron Devices, vol. 38, No. 5, May 1991, pp. 1124–1130.

A Köck, et al., "Double Wavelength Selective GaAs/AlGaAs Infrared Detector Device", Applied Physics Letters 60(16), Apr. 20, 1992, pp. 2011–2013.

I. Gravé, et al. "Voltage–Controlled Tunable GaAs/AlGaAs Multistack Quantum Well Infrared Detector", Applied Physics Letters 60 (19), May 11, 1992, pp. 2362–2364.

(List continued on next page.)

Primary Examiner—Constantine Hannaher
Assistant Examiner—Timothy Moran
(74) Attorney, Agent, or Firm—Burns, Doane, Swecker & Mathis, L.L.P.

(57) ABSTRACT

A quantum well infrared focal plane array achieves hyper-spectral measurements of incident infrared radiation using a voltage dividing network that applies different and adjustable biasing voltages to each line of the line by column array. The peak wavelengths of each quantum well layer of each detector structure in the array is set to a specified nominal value by appropriate fabrication of the depths of the quantum wells of the layers. The nominal peak wavelength value of each quantum well layer can further be varied by modulating the bias voltage applied to the gate of the direct injection transistor associated with each detector structure of the array. A read out integrated circuit (ROIC) containing the direct injection transistor processes the photo-current from each quantum well layer of each detector structure. Using an n by n array of vertically stacked detector structures, along with the associated ROIC, a focal plane array can be fabricated where each row of detector elements in the array is responsive to different peak wavelengths.

21 Claims, 6 Drawing Sheets

OTHER PUBLICATIONS

E. Martinet, et al., Switchable Bicolor (5.5–9.0 μm) Infrared Detector Using Asymmetric GaAs/AlGaAs Multiquantum Well, Applied Physics Letters 61 (3), Jul. 20, 1992, pp. 246–248.

K. Kheng, et al., "Two–Color GaAs/(AlGa)As Quantum Well Infrared Detector With Voltage–Tunable Spectral Sensitivity At 3–5 and 8–12 μm", Applied Physics Letters 61 (6), Aug. 10, 1992, pp. 666–668.

K.L. Tsai, et al., "Two–Color Infrared Photodetector Using GaAs/AlGaAs and Strained InGaAs/AlGaAs Multiquantum Wells", Applied Physics Letters 62 (26, Jun. 28, 1993, pp. 3504–3506.

B.F.Levine, "Quantum–Well Infrared Photodetectors", Jornal of Applied Physics 74 (8), Oct. 15, 1993, pp. 1–87.

C.G. Bethea, et al., "Long Wavelength Infrared 128×128 $Al_xGa_{1-x}As$/GaAs Quantum Well Infrared Camera and Imaging System", IEEE Transactions on Electron Devices, vol. 40, No. 11, Nov. 1993, pp. 1957–1963.

G. Sarusi, et al., "Improved Performance of Quantum Well Infrared Photodetectors Using Random Scattering Optical Coupling", Applied Physics Letters 64 (8), Feb. 21, 1994, pp. 960–962.

Y.H. Wang, et al., "A GaAs/AlAs/AlGaAs and GaAs/AlGaAs Stacked Quantum Well Infrared Photodetector For 3–5 and 8–14 μm Detection", Journal of Applied Physics 76(4), Aug. 15, 1994, pp. 2538–2540.

M.Z. Tidrow, et al., "Grating Coupled Multicolor Quantum Well Infrared Photodetectors", Applied Physics Letters 67 (13), Sep. 25, 1995, pp. 1800–1802.

C.J. Chen, et al., Corrugated Quantum Well Infrared Photodetectors For Normal Incident Light Coupling, Applied Physics Letter 68 (11), Mar. 11, 1996, pp. 1446–1448.

T.R. Schimert, et al., "Enhanced Quantum Well Infrared Photodetor With Novel Multiple Quantum Well Grating Structure", Applied Physics Letter 68 (20), May 13, 1996, pp. 2846–2848.

W.A. Beck, et al., "Imaging Performance of 256×256 LWIR Miniband Transport Multiple Quantum Well Focal Plane Arrays", pp. 1–14, Proc. Second Int. Symp. 2–20 μm Wavelength Infrared Dets. and Arrays: Phys. and Appl., Oct. 10–12, 1994, Miami Beach, Florida.

* cited by examiner

PROGRAMMABLE HYPER-SPECTRAL INFRARED FOCAL PLANE ARRAYS

The present application is related to application Ser. No. 09/666,847, entitled "Three Color Quantum Well Focal Plane Arrays", application Ser. No. 09/666,301, entitled "Two Color Quantum Well Focal Plane Arrays," application Ser. No. 09/666,297, entitled "Remote Temperature Sensing Long Wavelength Modulated Focal Plane Array, application Ser. No. 09/665,959, entitled "Clutter Discriminating Focal Plane Array," and application Ser. No. 09/666,296, entitled "Large Dynamic Range Focal Plane Array," all filed on even date herewith. The disclosures of the above identified Patent Applications are herein incorporated by reference.

BACKGROUND OF THE INVENTION

1. Field of the Invention

The present invention is directed generally to Quantum Well Infrared photodetector Focal Plane Arrays (QWIP FPA's) and, more particularly, to QWIP FPA's that are capable of multicolor detection.

2. State of the Art

Multicolor infrared detection capability has wide applicability to a number of different applications including aerospace, medical, surveying, mining, and agriculture. For example, multicolor infrared detection can provide useful information during geographical surveys. Detection in at least two infrared spectral bands would permit differentiation between man-made structures and natural landscape in a geographical survey. Additionally, in medical applications, multi-color detection would permit improved thermal imaging of the human body for diagnostic purposes.

Multicolor infrared detection has been conventionally performed using a wide-band IR detector and an associated rotating mechanical multicolor filter wheel. The wide-band IR detector detects a broad range of incident wavelengths and the rotating filter wheel selects the desired wavelength that is to be passed to the wide-band detector. An exemplary color wheel system is disclosed in U.S. Pat. No. 5,300,780. Mechanical color wheel systems, however, suffer from a number of deficiencies in multicolor detection. Such systems generally are slow and bulky, require large amounts of power for operation, and have a limited life span. Additionally, color wheel systems tend to have poor photon collection efficiency.

To alleviate some of the known deficiencies of the multicolor filter wheel, quantum well photodetectors have been constructed that permit the detection of more than one spectral band. One such quantum well photodetector is constructed using asymmetric quantum well layers that permit, in accordance with known principles, multicolor detection with a varying applied bias. An example of such a detector is described "Switchable Bicolor (5.5–9.0 $\mu$m) Infrared Detector Using Asymmetric GaAs/AlGaAs Multi-quantum well," Appl. Phys. Lett. 61 (3), Jul. 20, 1992 by Martinet et al. Varying the bias applied across such a photodetector varies the responsivity of the detector to impinging infrared radiation of different wavelengths. The multicolor detection capability of a single asymmetric quantum well layer in a single detector, however, has limited spectral responsivity. A single quantum well layer is only capable of being "tuned" within a specific spectral band that is limited by material parameters (e.g., quantum well depth) selected when constructing the detector. A single asymmetric quantum well layer in a single detector therefore does not permit multicolor detection over a wide spectral band.

SUMMARY OF THE INVENTION

Responsivity across a wide spectral range is achieved in exemplary embodiments of the invention by constructing the quantum well layers in a plurality of portions of an array of quantum well detectors so that the layers in each of the plurality of portions are responsive to different nominal peak wavelengths. A common voltage bias can be applied across each of the plurality of portions of the array to "tune," using the Stark effect, the detectors in each portion of the array to different peak wavelengths then every other portion of the array.

One exemplary embodiment of the present invention is directed to a photodetector array which comprises an array of photodetector structures and further includes a voltage bias means. The voltage bias means provides different voltages for biasing different groups of detector structures in the array.

An additional exemplary embodiment of the present invention is directed to a photosensitive device which comprises a first photosensitive layer and two or more photosensitive layers, where the photosensitive layers are formed adjacent one another. This exemplary embodiment further includes a means for modulating a bias voltage applied across each of said photosensitive layers, where the modulated bias voltage is selectively applied to each layer and varies spectral responsivities associated with each layer.

A further exemplary embodiment of the present invention is directed to a photodetector array which comprises a plurality of photodetector structures, each comprising: a first photosensitive layer; two or more photosensitive layers, wherein said photosensitive layers are formed adjacent one another; and means for modulating a bias voltage applied across each of said layers, wherein said modulated bias voltage is selectively applied to each layer and varies spectral responsivities associated with each layer.

A further exemplary embodiment of the present invention is directed to a method of detecting radiation comprising the steps of: receiving radiation of a first spectral band in a first portion of a detector structure; receiving radiation of a second spectral band in a second portion of said detector structure, wherein said radiation in said second spectral band first passes through said first portion of said detector before reaching said second portion of said detector; receiving radiation of a third spectral band in a third portion of said detector structure, wherein said radiation in said third spectral band first passes through said first and second portions of said detector before reaching said third portion of said detector; and selectively converting said radiation in said first, second, and third bands into quantities of moving charges.

An exemplary embodiment of the present invention is also directed to a photosensitive device comprising: first means responsive to impinging energy of a first spectral band; second means responsive to impinging energy of a second spectral band, wherein said impinging energy of said second spectral band first passes through said first means before reaching said second means; third means responsive to impinging energy of a third spectral band, wherein said impinging energy of said third spectral band first passes through said second means before reaching said third means; and means for selectively processing quantities of moving charges supplied from each of said first, second, and third means.

BRIEF DESCRIPTION OF THE DRAWINGS

Other objects and advantages of the invention will be apparent to those skilled in the art reading the following detailed description of the preferred embodiments in conjunction with the drawings in which like reference numbers have been used to indicate like elements, and wherein.

DETAILED DESCRIPTION OF THE PREFERRED EMBODIMENTS

Wide spectral band multicolor detection can be achieved in exemplary embodiments of the invention through the application of different bias voltages across the quantum well layer(s) of different groups of detector structures in a focal plane array. Application of the different bias voltages to different groups of detector structures in the array permits each group of detector structures to be "tuned" to a different spectral responsivity. A wide spectral range can therefore be detected by the array by "tuning" each group of detectors in the array to different, but overlapping, spectral ranges.

Based on well known physical principles, the vertical depths of the one or more quantum wells comprising a quantum well layer determines the energy required from impinging photons to permit carriers in the wells to escape for conduction. The vertical depths of the one or more quantum wells of the quantum well layer therefore determines the nominal spectral response of the layer to radiation in the form of impinging photons of various wavelengths. The allowed energy states in a quantum well are:

$$E_n = \frac{h^2 \cdot n^2}{8ml^2} \text{ Joules} \qquad \text{Eqn. (1)}$$

where h is Planck's constant=$6.626*10^{-34}$ Joule*seconds
m is the effective mass of the carrier
n is an integer n=1, 2, 3 . . .
$E_n$ is the energy of a given band in Joules
is the depth of the quantum well in meters.

For a carrier to move between the valence band (n=1) and the conduction band (n=2), the following energy $E_{1,2}$ is required to free the carrier from the valence band:

$$E_{1,2} = E_g = \frac{h^2(2^2 - 1^2)}{8ml^2} = \frac{3h^2}{8ml^2} \text{ Joules} \qquad \text{Eqn. (2)}$$

The energy required to free the carrier from the valence band to the conduction band ($E_{1,2}$) is alternatively called the energy gap, $E_g$. The energy given up by an impinging photon must be equal to or larger than the energy gap. Photon energy is related to the wavelength of the photon by the following:

$$E_g = \frac{hc}{\lambda_p} \text{ Joules} \qquad \text{Eqn. (3)}$$

where c is the velocity of light=$3*10^8$ meters/second (in a vacuum)
$\lambda_p$ is the peak wavelength corresponding to the middle of the band in meters.

By setting the photonic energy equal to the energy gap $E_g$ between the bands, the relationship of the well depth to the peak wavelength $\lambda_p$ needed to free carriers is demonstrated:

$$\lambda_p = \frac{8mcl^2}{3h} \text{ meters} \qquad \text{Eqn. (4)}$$

Eqn. (4) is based on a general model, and those skilled in the art will recognize that other factors can influence the proportionality constant between wavelength and well depth. However, the peak wavelength can generally be considered proportional to the well depth:

$$\lambda_p \alpha_o^2 \text{ meters} \qquad \text{Eqn. (5)}$$

where $a_o$, is a proportionality constant

Thus, it is evident by Eqn. (5) that the nominal spectral response of the one or more quantum wells comprising a quantum well layer can be "tuned" by altering the wells' depths.

Each quantum well layer of a QWIP can additionally be comprised of one or more asymmetric quantum wells. Asymmetric quantum wells are known in the art as is indicated by U.S. Pat. No. 5,355,000 and the journal article by Martinet et al., "Switchable Bicolor (5.5–9.0 μm) Infrared Detector Using Asymmetric GaAs/AlGaAs Multiquantum well," Appl. Phys. Lett. 61 (3), Jul. 20, 1992, the disclosures of which are herein incorporated by reference. Using asymmetric quantum wells, the spectral response of a quantum well layer can be tuned from the nominal wavelength $\lambda_p$ of Eqn. (5) through the known phenomenon called "band splitting." "Band splitting" can be induced in an asymmetric multiple quantum well through the application of an electric field across the quantum well. In the lowest energy state in an asymmetric quantum well, for example, this "band splitting" is represented by the following equation:

$$E_2 - E_{1+v} = \frac{h^2((2-v)^2 - (1+v)^2)}{8mL^2} \text{ joules} \qquad \text{Eqn. (6)}$$

where v is proportional to the applied bias voltage and represents the "split in the band."

Therefore, the peak wavelength needed to free carriers with an applied bias voltage is the following:

$$\lambda_p = \frac{8L^2 cm}{((2-\mathcal{E})^2 - (1+\mathcal{E})^2)h} \text{ meters} \qquad \text{Eqn. (7)}$$

or, in simplified form:

$$\lambda_p = \frac{8L^2 cm}{9(1-2\mathcal{E})^2 h} \text{ meters} \qquad \text{Eqn. (8)}$$

where E is the normalized electric field.

Thus, the peak wavelength $\lambda_p$ can be represented generally by the following equation:

$$\lambda_p = \frac{BL^2}{(1-v/3)^2} \text{ meters} \qquad \text{Eqn. (9)}$$

where v is the applied bias in volts and B is a constant. Eqn. (9) above therefore demonstrates that the peak wave length of a quantum well can be "tuned" from a nominal wavelength $\lambda_p$, that is initially set by the depth of each quantum well in the layer, by modulating the bias voltage one across the layer comprising one or more asymmetric quantum wells. This is called the quadratic Stark effect. Using the Stark effect, a quantum well layer comprising one or more asymmetric quantum wells can have its spectral responsivity adjusted to a plurality of peak wavelengths through the application of a plurality of bias voltages. Detection of infrared radiation over a wide spectral band can therefore be achieved.

Figure 1:
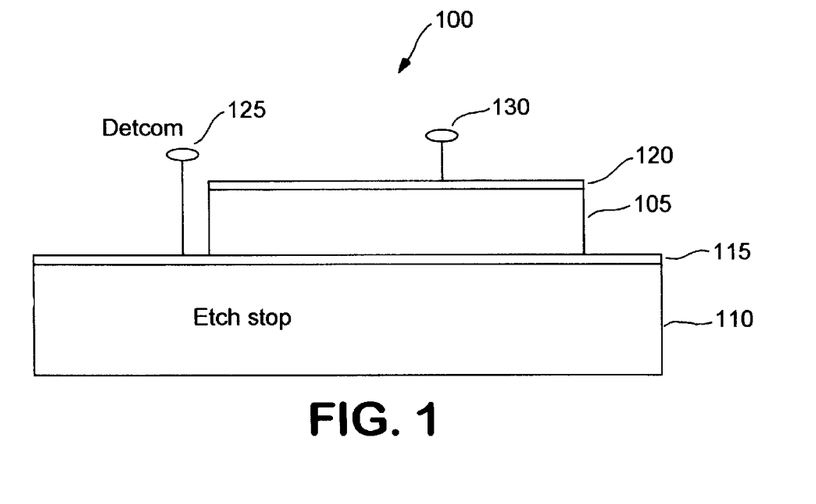
FIG. 1 is a structural diagram of a single layer quantum well detector in accordance with an exemplary embodiment of the present invention.

FIG. 1 illustrates an exemplary embodiment of a single quantum well layer detector 100 in accordance with the invention, where the photosensitive quantum well layer 105 has been fabricated to "tune" the layer to a nominal peak wavelength through appropriate adjustment of the depths of the one or more quantum wells comprising the quantum well layer 105 of the detector 100.

Detector 100 can be fabricated using any conventional process, including, but not limited to, a molecular beam epitaxy (MBE) process. First, an etch stop layer 110 is formed and then a first contact layer 115, doped to a first conductivity, is formed upon the etch stop layer 110. Next, a first quantum well layer 105 comprising one or more quantum wells of a depth corresponding to a first desired peak wavelength is formed over the first doped contact layer 115. This first quantum well layer 105 can include multiple sublayers composed of alternating barrier sublayers and quantum well sublayers. A second contact layer 120, doped to a second conductivity, is next formed upon the first quantum well layer 105. Contact layers 115 and 120 can be composed of, for example, doped GaAs (e.g., n+GaAs), though one skilled in the art will recognize that other suitable contact layer materials may be used. Quantum well layer 105 can be comprised of, for example, 20-period GaAs/Al$_x$Ga$_{1-x}$. As multi-quantum well stacks with the GaAs well depths and Al compositions adjusted to yield the desired peaks and spectral widths. One skilled in the art will recognize, however, that other multi-quantum well stacks can be used such as, for example, those used in U.S. Pat. No. 5,539,206 to Schimert, the disclosure of which is incorporated by reference herein.

Additionally, one skilled in the art will further recognize that various doping concentrations for the quantum wells and contact layers can be used in exemplary embodiments of the invention. For example, doping concentrations such as those used in the above-identified U.S. Patent to Schimert can be used in the present invention. Furthermore, the formation of each layer of the detector can be performed using any conventional techniques appropriate for the layer being established including, but not limited to, growth or deposition techniques.

The electrical connections for interfacing between detector 100 and a read out integrated circuit (ROIC) (not shown) are further illustrated in FIG. 1. First contact layer 115 is connected to the detector's common bias voltage (DETCOM) via electrical contact 125. A detector bias voltage can further be provided via electrical contact 130 to contact layer 120. The difference between DETCOM and the detector bias voltage supplied by the ROIC to electrical contacts 130 establishes the biasing voltage across quantum well layer 105 of the detector. Electrical contacts 125 and 130 can be, for example, formed as Indium "bumps," or as any conventional contact known to those skilled in the art.

Figure 2:
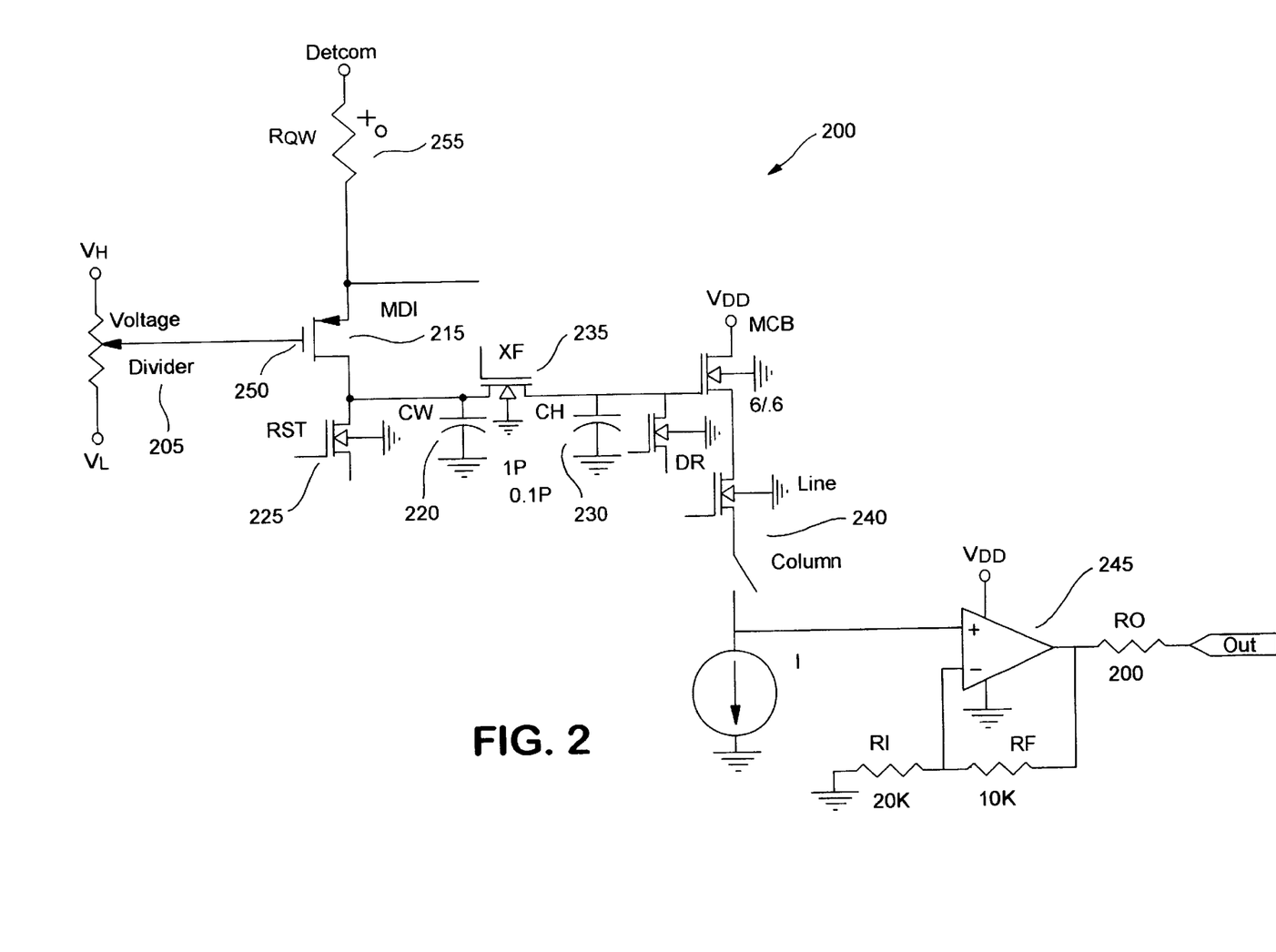
FIG. 2 is a schematic of a readout circuit in accordance with an exemplary embodiment of the invention.

Using the Stark effect, the quantum well layer 105 of FIG. 1, can be "tuned" to a plurality of peak wavelengths, thus creating a detector that can detect infrared radiation in multiple spectral bands. To process the photo-current from quantum well layer 105, a read out integrated circuit (ROIC) of another exemplary embodiment can be used. As schematically illustrated in FIG. 2, the read out circuit 200 of this exemplary embodiment uses a voltage divider 205 to modulate the bias applied across quantum layer 105 (represented in FIG. 2 as quantum well effective resistance R$_{QW}$ 255). To process the photo-current from the selected quantum well layer, the read out circuit 200 uses a direct injection transistor 215, a single charge well 220, a reset switch 225, a charge storage capacitor C$_H$ 230, a charge transfer switch 235, a time division multiplexer 240, and an output amplifier 245.

Circuit 200, through the switching of reset switch RST 225 and the charge transfer switch 235, performs a dump, ramp, and sample (DRS) process that integrates the output of the photo-current of quantum well layer 105. To provide a photo-current from the quantum well layer, the direct injection transistor 215 maintains a relatively constant voltage across the quantum well layer for the duration of each DRS integration period. The voltage bias across the selected quantum well layer can be modulated, to "tune" the spectral response of the asymmetric quantum well layer, by changing the injection transistor gate bias voltage 250 through programmed adjustments to the voltage divider 205.

Figure 3:
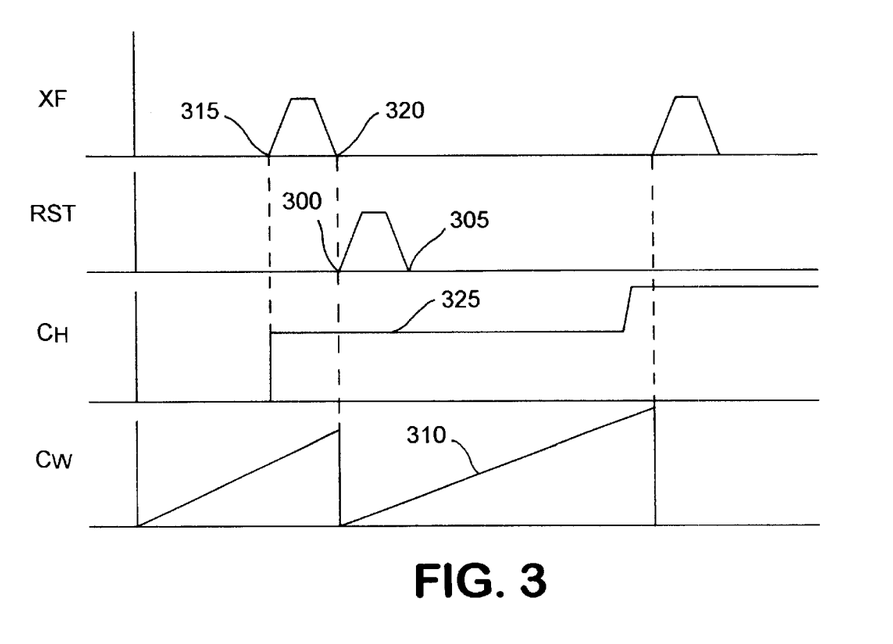
FIG. 3 is a timing diagram corresponding to the operation of the read out circuit of FIG. 2.

A switched capacitor filter with a single charge well C$_W$ 220 and a charge storage capacitor C$_H$ 230 can be used for processing the current supplied from the quantum well 105. During the DRS process, the RST switch 225 is first closed (300; FIG. 3) for a time period to "dump" any charge stored in the charge well 220. The RST switch 225 is then opened (305; FIG. 3) and the photo-current from the detector begins to cause charge to be accumulated (310; FIG. 3) in the charge well C$_W$ 220.

When a sufficient quantity of charges is stored in charge well C$_W$ 220, switch XF 235 is closed (315; FIG. 3) to transfer the charges from the "cup" capacitor C w 220 to the "bucket" capacitor C$_H$, 230 (325; FIG. 3). When the stored charge in the "cup" is sufficiently emptied into the "bucket," switch XF 235 is opened (320; FIG. 3). A voltage derived from the charges stored in C$_H$ 230 is supplied, via the time division multiplexer 240, to output amplifier 245. One skilled in the art will recognize that the above described dump-ramp-sample capacitor filter arrangement can be replaced with a cup and bucket switched capacitor filter arrangement as described in U.S. Pat. No. 5,629,522, entitled "Apparatus for and Method of Providing Long Integration Times in an IR Detector," the disclosure of which is incorporated herein by reference.

Figure 5:
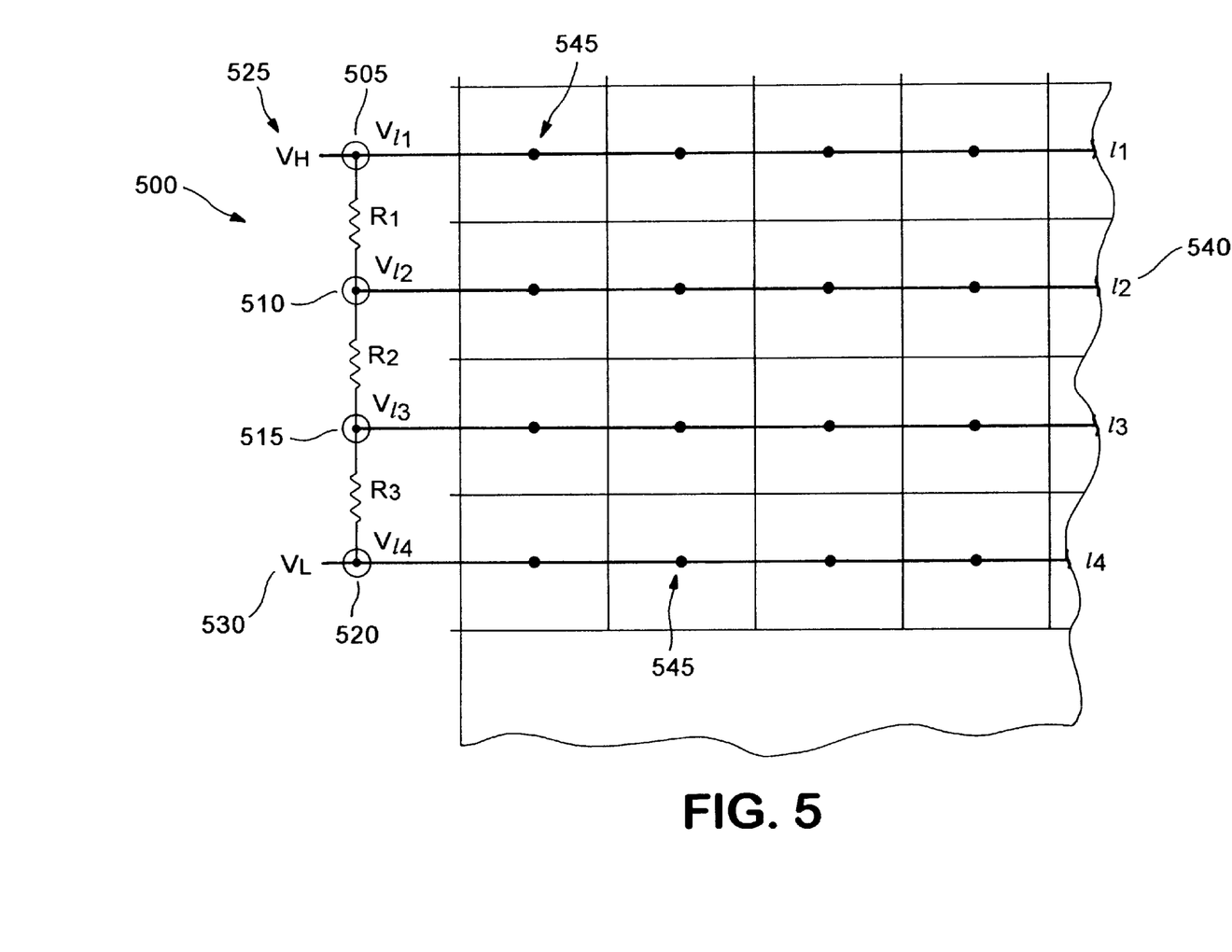
FIG. 5 is a diagram of a voltage dividing network of an exemplary embodiment of the invention.

In an additional exemplary embodiment, an array of detector elements, such as the detector element shown in FIG. 1, can be fabricated using conventional techniques, where ROIC circuitry (such as the circuit of FIG. 2) is electrically interfaced with each detector element of the array. In biasing such an array, an exemplary voltage dividing network 500 (corresponding to voltage divider 205 in FIG. 2) can be used as illustrated in FIG. 5. As shown in this Figure, a voltage dividing network 500 can be used to supply a bias to the gate 250 (FIG. 2) of the direct injection transistor 215 (FIG. 2) of each read-out circuit associated with each detector of the focal plane array. In this exemplary embodiment, only four lines of an array are shown for purposes of illustration. It will be appreciated, however, that a voltage dividing network can be used to supply voltages to all l lines of an l×c (line by column) array. The voltage dividing network 500 is illustrated as comprising (l−1) resistors, where l represents the number of lines in a l×c array. Bias voltages $V_H$ 525 and $V_l$ 530 are connected across the voltage dividing network 500. Line voltages $V_{lx}$ ($V_{l1}$, $V_{l2}$, ..., $V_{lx}$) are derived from the voltage dividing network 500 and supplied to each read out circuit associated with each detector element in line $l_x$ of the array. For example, as shown in FIG. 5, the voltage $V_{l2}$ 510 at the bottom of $R_l$ 535 supplies, via bias line $l_2$ 540, the bias voltage to the gate 250 (FIG. 2) of the direct injection transistor 215 (FIG. 2) of each read out circuit associated with each detector element in line $l_2$ of the focal plane array. Voltages $V_{lx}$ ($V_{l1}$, ... $V_{lx}$) can be supplied to the read out integrated circuitry (ROIC) via conductive bumps 545 (e.g., Indium bumps).

Application of the voltage dividing network 500, shown in FIG. 5, across an n×n array, where each detector of the array is associated with a read-out circuit, permits the realization of a real-time programmable hyper-spectral focal plane array. In such as an array, each line of detector elements can be fabricated to respond to different nominal peak wavelengths. The nominal peak wavelengths $\lambda_p$ of each line of the array can further be "tuned," using the Stark effect, to a desired wavelength by adjusting the voltage magnitude and polarity of $V_H$ and $V_L$ applied across the voltage dividing network 500. An n×n array (256×256 is typical) can therefore be constructed where each row of detector elements is "tuned" by a voltage bias to respond to different peak wavelengths, thus enabling a wide spectral range to be detected.

It will be appreciated by one skilled in the art that the voltage dividing network 500 can be modified to provide bias to the gates of the direct injection transistors on other than a line by line basis. For example, the voltage dividing network can be configured to provide bias to designated groups of detectors within the array instead of each line of the array. One skilled in the art will further recognize that other biasing configurations can easily be provided.

Figure 4:
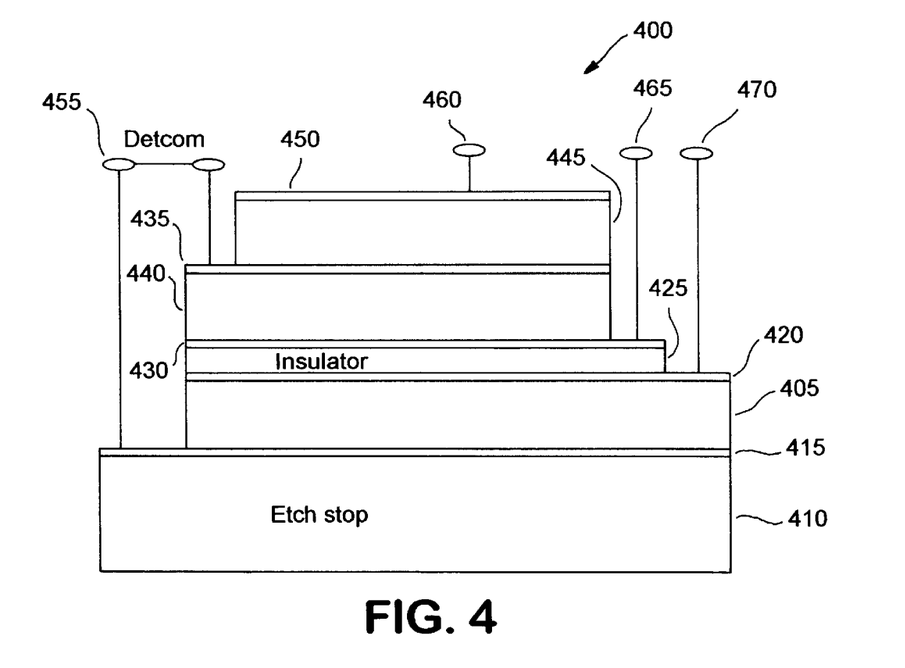
FIG. 4 is a structural diagram of a three color quantum well detector in accordance with another exemplary embodiment of the present invention.

In additional exemplary embodiments, the QWIP array can be comprised of multi-layer quantum well detector structures such as those described in co-pending application Ser. No. 09/666,301, entitled "Two Color Quantum Well Focal Plane Arrays," and application Ser. No. 09/666,847, entitled "Three Color Quantum Well Focal Plane Arrays." FIG. 4 illustrates a detector structure 400, described in the above-identified "Three Color" application, which includes three quantum well layers 405, 440, and 445. The formation of the exemplary three quantum well layer structure is described in application Ser. No. 09/666,847 and includes an etch stop layer 410, a first contact layer 415, a first quantum well layer 405, a second contact layer 420, an insulating layer 425, a third contact layer 430, a second quantum well layer 440, a fourth contact layer 435, a third quantum well layer 445, and a fifth contact layer 450.

Referring to FIG. 4, the electrical connections for interfacing between the detector structure 400 and the Read Out Integrated Circuit (ROIC) (not shown) of one exemplary embodiment can be seen. As illustrated in the Figure, a common contact 455 is connected between the doped contact layer 415 on one side of the first quantum well layer 405 and the doped contact 435 layered between the two quantum well layers 440, 445. Common contact 455 is additionally connected to the detector's common bias voltage (labeled DETCOM) of the ROIC. Additionally, individual detector bias voltages can be provided via electrical contacts 460, 465, and 470 to contact layers 450, 430, and 420, respectively, to thereby access each band separately. Thus, the bias voltage across each layer can be modulated independently of any other layer. The difference between the common bias voltage and the individual bias voltages supplied by the ROIC to each of the electrical contacts 460, 465, and 470 selectively establishes bias voltages across each of the quantum well layers 405, 440, and 445 of the detector. Electrical contacts 460, 465, and 470, each being associated with a different one of the quantum well layers 445, 440, and 405, thus provide means for biasing each band independently in conjunction with the individual bias voltages supplied by the ROIC.

During operation, contacts 460, 465, and 470 constitute outputs of the detector which selectively supply photocurrent from each quantum well to the ROIC circuitry. Electrical contacts 460, 465, and 470 can be, for example, formed as Indium "bumps," or as any conventional contact known to those skilled in the art. Contact layers 415 and 435 can be tied to the common bias voltage DETCOM externally, via Indium bumps, to an appropriate pattern on the read out circuit. This exemplary embodiment therefore includes five bumps per pixel.

Figure 6:
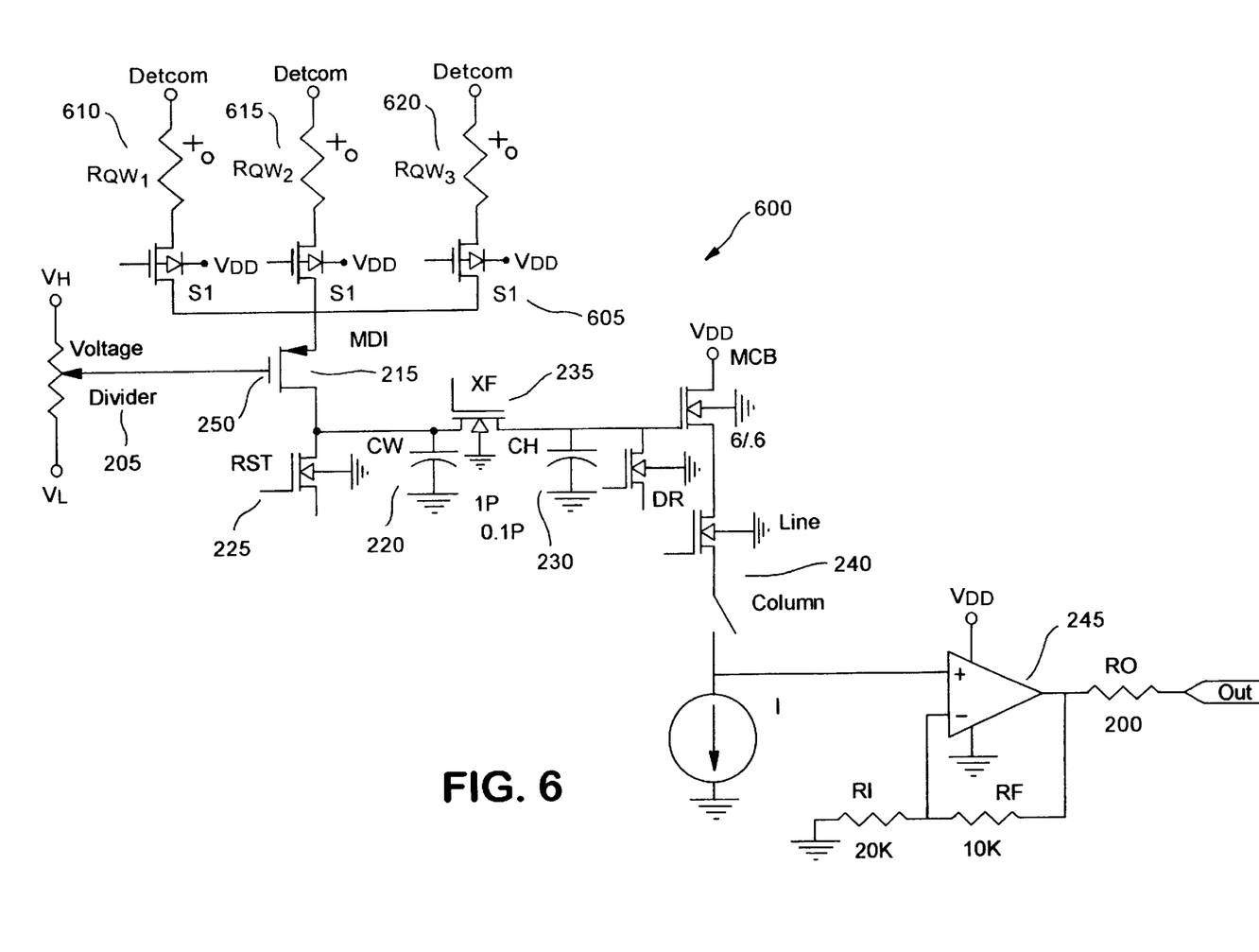
FIG. 6 is a schematic of a readout circuit in accordance with another exemplary embodiment of the invention.

An exemplary read out circuit 600 that can be used with the multi-layer detector of FIG. 4 is schematically illustrated in FIG. 6. The design and operation of circuit 600 is similar to that of circuit 200 described above and schematically illustrated in FIG. 2 (with corresponding circuit components identically labeled). The principle difference of the circuit of FIG. 6, as compared to the circuit of FIG. 2, is the addition of a ganged selector switch S1 605 which can be used to select which quantum well layer of the multi-layer detector from which photo-current will be processed. Switch S1 605 of each read-out circuit 600 in the array can be programmed to select a quantum well layer fabricated to respond to a specific nominal peak wavelength $\lambda_p$ (e.g., $R_{Qw1}$, $R_{Qw2}$, $R_{Qw3}$ shown in FIG. 6 corresponding to quantum well layers 405, 440 and 445 shown in FIG. 4). This nominal peak wavelength $\lambda_p$ can further be "tuned," using the Stark effect, to a desired wavelength by adjusting the voltage magnitude and polarity of $V_H$ and $V_L$ of the voltage dividing network 500 shown in FIG. 5.

Figure 7:
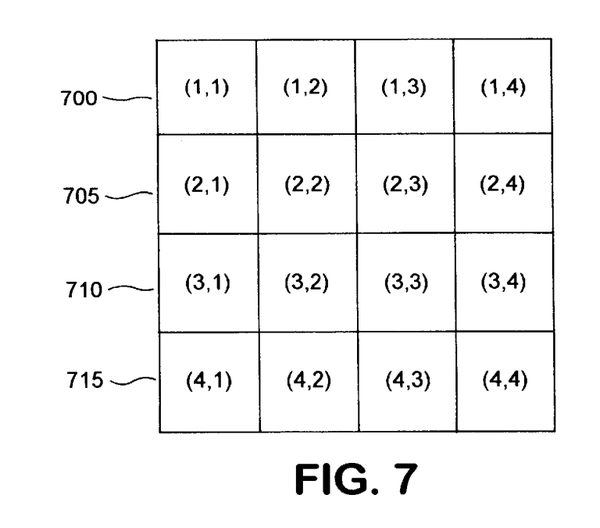
FIG. 7 is a diagram of an exemplary 4×4 detector array.
Figure 8:
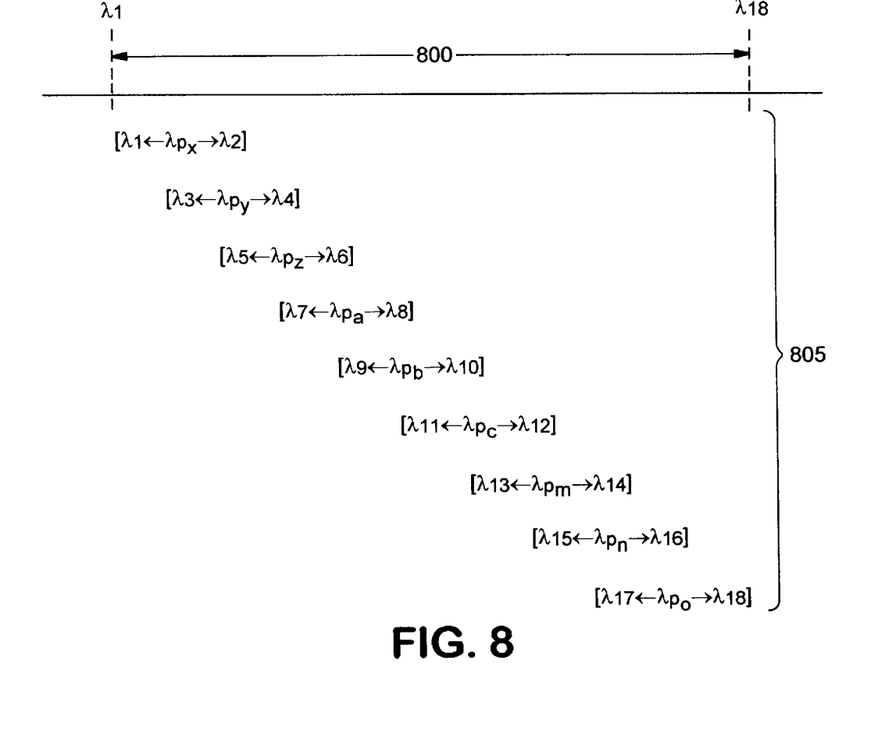
FIG. 8 is a plot showing a width of a spectral range detectable by an exemplary embodiment of the invention.

Use of an n×n array of vertically stacked multi-layer detector elements, where each detector element of the array is associated with a read-out circuit as illustrated in FIG. 6, thus permits the realization of a real-time programmable hyperspectral focal plane array that can detect an even wider spectral range then the single layer detector of FIG. 1. This can be illustrated beginning with FIG. 7 which shows an exemplary 4×4 detector array, where each detector in the array has a designated position (e.g., {(1,1), (1,2), . . . , (4,4)}. If a line by line hyperspectral array using three quantum layer detectors is used then every detector in a line can be fabricated to be responsive to three specified nominal wavelengths. For example, quantum layers 405, 440 and 445 of each detector of line 1 700 can be fabricated to be responsive to nominal wavelengths $\lambda_{ps}$, $\lambda_{py}$, and $\lambda_{pz}$. The three quantum well layers of each detector of line 2 705 can be fabricated to be responsive to nominal wavelengths $\lambda_{pa}$, $\lambda_{pb}$, and $\lambda_{pc}$. The layers of the detectors of line 3 710 can be fabricated to nominal wavelengths $\lambda_{pm}$, $\lambda_{pn}$, and $\lambda_{po}$ and line 4 715 to $\lambda_{ps}$, $\lambda_{pt}$, and $\lambda_{pv}$. Therefore, if the different quantum well layers of each line of the array are appropriately fabricated, and direct injection transistor gate bias voltage ranges are appropriately selected, a wide spectral range such 800 as that illustrated in FIG. 8 can be detected due to the overlapping spectral response 805 of each quantum well layer of each detector of each line of the array. The range in wavelengths shown in FIG. 8, for each quantum well layer nominal peak wavelength $\lambda_p$, is due to the Stark effect induced by modulating the quantum well layer bias voltage such as, for example, adjusting the voltage magnitude and polarity of $V_H$ and $V_L$ of the voltage dividing network of FIG. 5.

The read out circuit of FIG. 6 is illustrated as processing the photo-current from three different quantum well layers (such as 405, 440, and 445 of FIG. 4). However, one skilled in the art will recognize that the switch arrangement S1 605 shown in FIG. 6 can be modified to select any number of quantum well layers. For example, the switch arrangement of FIG. 6 can be modified to process the photo-currents from the five different quantum well layers of the detector described in co-pending application Ser. No. 09/666,847. Additionally, it will be appreciated that the switch S1 605 of each read out circuit in a group of detectors (such as a line of the detector array) can be "ganged" together such that switches S1 for each read out circuit in a line of detectors are switched together to select an appropriate layer of each multi-layer quantum well detector. It will further be appreciated that the voltage dividing resistances ($R_1$, $R_2$, etc.) of FIG. 5 can further be individually adjustable such that the bias applied to the lines of the array can be varied without changing the applied voltages $V_H$ and $V_L$.

In an additional exemplary embodiment of the invention, higher density focal plane arrays can be produced by removing the charge wells from the ROIC and fabricating the charge wells within the detector structure itself. The smaller pitch required of higher density arrays limits the usable area available for the charge wells in the ROIC underlying the detector structure. By fabricating the charge wells integrally to the detector itself, less space is required in the underlying ROIC and therefore higher densities can be achieved in the array. The technique of using integral charge wells is disclosed in U.S. patent application Ser. No. 09/149,483, entitled "Integral Charge Well for QWIP FPA's," the disclosure of which is herein incorporated by reference.

Optical coupling, in accordance with exemplary embodiments of the invention, can be achieved using a number of different techniques. Principles of quantum selection require that incident electromagnetic fields propagate in the horizontal plane of the quantum well. The incident flux must therefore be reflected inside the quantum well at an angle such that the flux passes through the material many times. In one exemplary embodiment, a rotated waffle diffraction grating is used, where the width of the waffle corresponds to one wavelength, the length of the waffle to another, and the diagonal to a third wavelength. The waffle grating, combined with a top side grating and side wall reflecting mirrors, constitute the optimum "photon in a box" quantum well detector optical system. Additionally, the waffle grating can be enhanced with a flux entry side anti-reflective coating composed of, for example, a quarter wavelength dielectric material. In addition to the waffle grating, one skilled in the art will recognize that a number of different techniques can be used for achieving optical coupling in the present invention. Such techniques include use of random gratings, reflectors, resonance structures, and so forth.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A photodetector array comprising:
   an array of photodetector structures; and
   means for providing different voltages for independently biasing different groups of detector structures in the array.

2. The photodetector array of claim 1, wherein said different voltages produce different spectral responsivities for each group of detector structures in the array.

3. The photodetector array of claim 1, wherein the photodetector structures of the array are arranged in lines and columns.

4. The photodetector array of claim 3, wherein said different groups of detector structures are different lines of the array.

5. The photodetector array of claim 4, wherein said different voltages produce different spectral responsivities in the different lines of the array.

6. The photodetector array of claim 1, wherein said different voltages are applied to the gates of transistors which bias each photodetector structure in the array.

7. The photodetector array of claim 1, wherein each photodetector structure of the array comprises a plurality of quantum well layers.

8. The photodetector array of claim 7, wherein said different voltages are applied to the gates of transistors which bias each quantum well layer of said plurality of quantum well layers of each photodetector structure of the array.

9. The photodetector array of claim 7, wherein each quantum well layer of the plurality of quantum well layers further comprises an asymmetric quantum well layer.

10. The photodetector array of claim 7, further comprising:
    means for selectively integrating photo-currents from each quantum well layer of the plurality of quantum well layers of each photodetector structure of the array.

11. The photodetector array of claim 1, wherein each photodetector structure comprises a single quantum well layer.

12. A photosensitive device comprising:
    a first photosensitive layer;
    two or more photosensitive layers, wherein said photosensitive layers are formed adjacent one another; and
    means for independently modulating a bias voltage applied across each of said photosensitive layers, wherein said modulated bias voltage is selectively applied to each layer and varies spectral responsivities associated with each layer.

13. The photosensitive device of claim 12, wherein said photosensitive layers comprise quantum well layers.

14. The photosensitive device of claim 12, further comprising:
    means for selectively integrating photo-currents from each of said photosensitive layers.

15. The photosensitive device of claim 12, wherein said first photosensitive layer comprises one or more quantum wells and wherein each of said one or more quantum wells comprises a first depth selected on the basis of a desired peak wavelength.

16. The photosensitive device of claims 15, wherein said desired peak wavelength is varied based on the bias voltage applied across said first photosensitive layer.

17. The photosensitive device of claim 12, wherein each of said two or more photosensitive layers comprises one or more quantum wells and further wherein each of said one or more quantum wells comprises a depth selected on the basis of a desired peak wavelength.

18. The photosensitive device of claim 17, wherein said desired peak wavelength is varied based on the bias voltage applied across each of said two or more photosensitive layers.

19. A photodetector array comprising:
  a plurality of photodetector structures, each comprising:
    a first photosensitive layer;
    two or more photosensitive layers, wherein said photosensitive layers are formed adjacent one another; and
    means for independently modulating a bias voltage applied across each of said layers, wherein said modulated bias voltage is selectively applied to each layer and varies spectral responsivities associated with each layer.

20. A method of detecting radiation comprising the steps of:
  receiving radiation of a first spectral band in a first portion of a detector structure;
  receiving radiation of a second spectral band in a second portion of said detector structure, wherein said radiation in said second spectral band first passes through said first portion of said detector before reaching said second portion of said detector;
  receiving radiation of a third spectral band in a third portion of said detector structure, wherein said radiation in said third spectral band first passes through said first and second portions of said detector before reaching said third portion of said detector;
  selectively converting said radiation in said first, second, and third spectral bands into quantities of moving charges; and
  independently modulating a responsivity of each of the first, second and third portions of the detector structure to the corresponding spectral band.

21. A photosensitive device comprising:
  first means responsive to impinging energy of a first spectral band;
  second means responsive to impinging energy of a second spectral band, wherein said impinging energy of said second spectral band first passes through said first means before reaching said second means;
  third means responsive to impinging energy of a third spectral band, wherein said impinging energy of said third spectral band first passes through said second means before reaching said third means;
  means for selectively processing quantities of moving charges supplied from each of said first, second, and third means; and
  means for independently modulating the responsivity of each of the first, second, and third means to the corresponding spectral band.

* * * * *